(12) United States Patent
Kang

(10) Patent No.: US 7,414,876 B2
(45) Date of Patent: Aug. 19, 2008

(54) NONVOLATILE FERROELECTRIC MEMORY DEVICE HAVING POWER CONTROL FUNCTION

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 10/879,186

(22) Filed: Jun. 30, 2004

(65) Prior Publication Data

US 2005/0099838 A1    May 12, 2005

(30) Foreign Application Priority Data

Nov. 10, 2003  (KR) ...................... 10-2003-0079148

(51) Int. Cl.
*G11C 11/22* (2006.01)

(52) U.S. Cl. ............. 365/145; 365/230.05; 365/189.05; 365/189.11

(58) Field of Classification Search ................. 365/145, 365/189.11, 189.09, 230.05, 189.05
See application file for complete search history.

(56) References Cited

U.S. PATENT DOCUMENTS

| | | | | |
|---|---|---|---|---|
| 5,892,706 | A * | 4/1999 | Shimizu et al. | ............. 365/145 |
| 6,087,885 | A * | 7/2000 | Tobita | ........................ 327/379 |
| 6,215,692 | B1 * | 4/2001 | Kang | ......................... 365/145 |
| 6,272,594 | B1 | 8/2001 | Gupta et al. | |
| 6,285,576 | B1 * | 9/2001 | Kang | ......................... 365/145 |
| 6,363,439 | B1 | 3/2002 | Battles et al. | |
| 6,422,473 | B1 * | 7/2002 | Ikefuji et al. | ................. 235/492 |
| 6,452,829 | B1 * | 9/2002 | Yamada | ....................... 365/145 |
| 6,483,357 | B2 * | 11/2002 | Kato et al. | ................... 327/143 |
| 6,525,362 | B2 * | 2/2003 | Sadayuki | ..................... 257/298 |
| 6,535,421 | B1 * | 3/2003 | Ozawa | .................. 365/185.09 |
| 6,768,689 | B2 * | 7/2004 | Origasa | ................. 365/189.11 |
| 6,809,952 | B2 * | 10/2004 | Masui | ........................ 365/145 |
| 6,819,584 | B2 * | 11/2004 | Noh | ............................ 365/145 |
| 6,828,842 | B2 * | 12/2004 | Saito et al. | ................... 327/318 |
| 6,856,535 | B2 * | 2/2005 | Madan | ........................ 365/145 |
| 2003/0112650 | A1 * | 6/2003 | Kang | ......................... 365/145 |

FOREIGN PATENT DOCUMENTS

KR     2002-0085533        12/2002

OTHER PUBLICATIONS

Yamada et.al., A 128-kb FeRAM Macro for Contact/Contactless Smart-Card Microcontrollers, IEEE Journal of Solid State Circuits, vol. 37, No. 8, Aug. 2002, pp. 1073-1079.*

* cited by examiner

*Primary Examiner*—Hoai V. Ho
*Assistant Examiner*—Kretelia Graham
(74) *Attorney, Agent, or Firm*—Townsend and Townsend and Crew LLP

(57) ABSTRACT

A nonvolatile ferroelectric memory device having a power control function improves a sensing margin by stably controlling a power applied to a cell capacitor. The sensing margin of a cell can be improved by controlling an operation voltage of the cell depending on an external supply voltage VEXT and applying a power voltage VCC obtained by dropping an external power voltage to adjacent circuits. Additionally, the reliability of a capacitor at a high voltage can be improved by employing a ferroelectric capcitor for stabilizing power to obtain capacitance of high capacity with a small area.

7 Claims, 11 Drawing Sheets

NONVOLATILE FERROELECTRIC MEMORY DEVICE HAVING POWER CONTROL FUNCTION

This application claims priority to Korean Patent Application No. 10-2003-0079148, filed Nov. 10, 2003.

BACKGROUND OF THE INVENTION

1. Field of the Invention

The present invention generally relates to a nonvolatile ferroelectric memory device, and more specifically, to a technology of stably controlling a power source applied to a cell capacitor, thereby improving a sensing margin.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2002-85533 by the same inventor of the present invention. Therefore, the basic structure and the operation on the FeRAM are not described herein.

Meanwhile, as the pattern size of a semiconductor memory device becomes smaller, an operation voltage of a CMOS device is reduced at the same ratio. When the operation voltage of the CMOS device drops, the power consumption of the semiconductor memory device is also reduced.

In general, a capacitor included in the conventional FeRAM cell corresponds to a device which requires a relatively higher voltage. As a result, when the FeRAM cell is operated, a power voltage VCC is pumped to rise to an external power voltage VEXT level.

However, since the external power voltage VEXT having a high voltage level is also applied to adjacent circuits which do not require the high voltage except a cell capacitor, the power consumption of the semiconductor memory device increases. In addition, the area of the whole system board also increases because an additional power supply circuit for controlling power of the memory cell is included in the outside of a chip.

SUMMARY OF THE INVENTION

Accordingly, it is the first object of the present invention to improve a sensing margin of a cell and reduce unnecessary power consumption by controlling an operation voltage of the cell depending on an external supply voltage VEXT and applying a power voltage VCC obtained by dropping an external power voltage to adjacent circuits.

It is the second object of the present invention to improve reliability of a capacitor at a high voltage by employing a ferroelectric capacitor for stabilizing power to obtain capacitance of high capacity with a small area.

It is the third object of the present invention to simplify configuration of a system board and vary a regulation range of power by positioning a power supply circuit not in the outside but in the inside of a chip.

In an embodiment, a nonvolatile ferroelectric memory device having a power control function comprises a voltage dropping unit, a nonvolatile ferroelectric circuit unit and a power stabilization unit. The voltage dropping unit drops an external power voltage to a predetermined level and supplies a power voltage. The nonvolatile ferroelectric circuit unit comprising a nonvolatile ferroelectric capacitor reads/writes data stored in a cell depending on the power voltage. The power stabilization unit removes noise from the power voltage applied from the voltage dropping unit and provides a stabilized voltage.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with the accompanying drawings.

Figure 1:
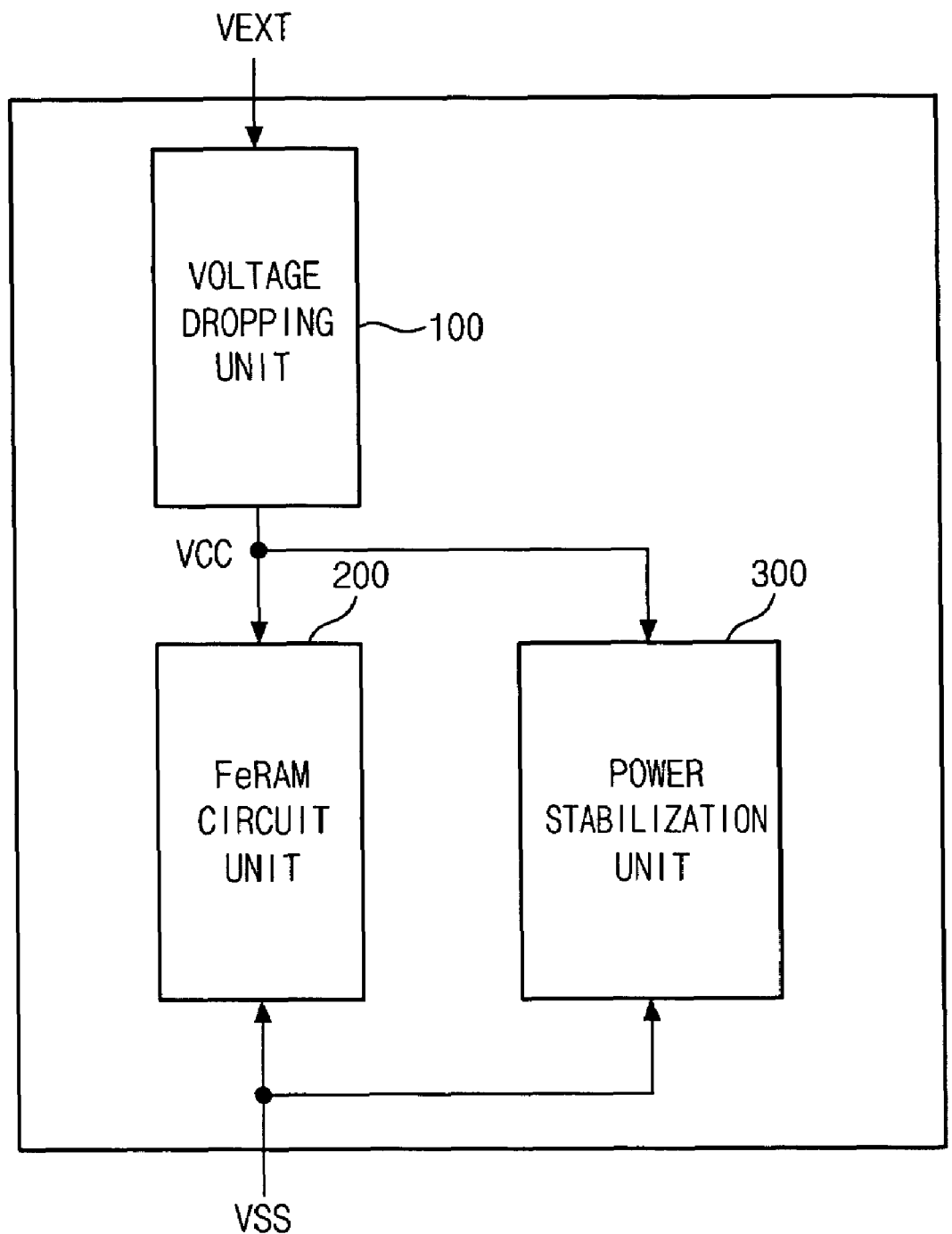
FIGS. 1 to 3 are diagrams illustrating examples of a nonvolatile FeRAM device having a power control function according to an embodiment of the present invention.

FIG. 1 is a diagram illustrating a first example of a nonvolatile FeRAM device having a power control function according to an embodiment of the present invention.

In the first example, the nonvolatile FeRAM device comprises a voltage dropping unit 100, a FeRAM circuit unit 200 and a power stabilization unit 300.

Here, the power dropping unit 100 drops an external power voltage VEXT applied externally to a predetermined level, and supplies a power voltage VCC. The FeRAM circuit unit 200 comprises cell arrays and a regulation circuit for driving the nonvolatile FeRAM device. The FeRAM circuit unit 200 drives a memory cell depending on the power voltage VCC supplied from the power dropping unit 100. The power stabilization unit 300 removes noise generated from the power voltage VCC supplied from the power dropping unit 100, and stabilizes the voltage.

Figure 2:
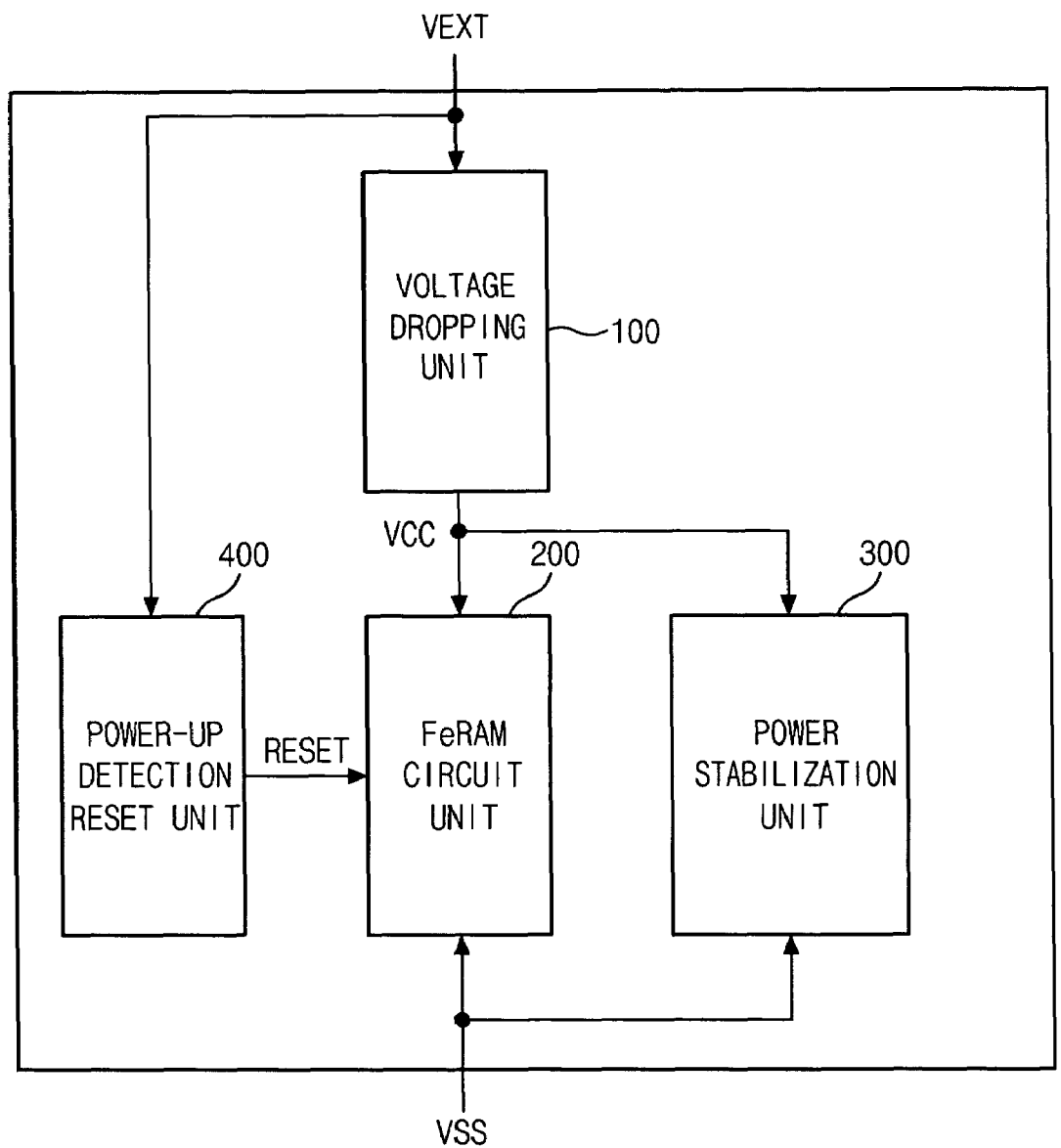

FIG. 2 is a diagram illustrating a second example of a nonvolatile FeRAM device having a power control function according to an embodiment of the present invention.

In the second example, the nonvolatile FeRAM device comprises a voltage dropping unit 100, a FeRAM circuit unit 200, a power stabilization unit 300 and a power-up detection reset unit 400. Here, the second example of FIG. 2 further comprises the power-up detection reset unit 400 in comparison with the first example of FIG. 1.

The power-up detection reset unit 400 detects a power-up voltage level, and generates a reset signal RESET to initialize the operation of the FeRAM circuit unit 200. Here, the power-up detection reset unit 400 detects the power-up voltage level depending on the external power voltage VEXT at a power-up mode.

As a result, the power-up detection reset unit 400 secures the stable operation of a chip while a voltage level of the reset signal RESET rises to that of the power voltage VCC. That is, when the voltage level of the reset signal RESET is at the level of the power voltage VCC, a margin of the voltage level for generating the reset signal RESET between the external power voltage VEXT and the power voltage VCC, thereby securing the stable operation of the chip.

Figure 3:
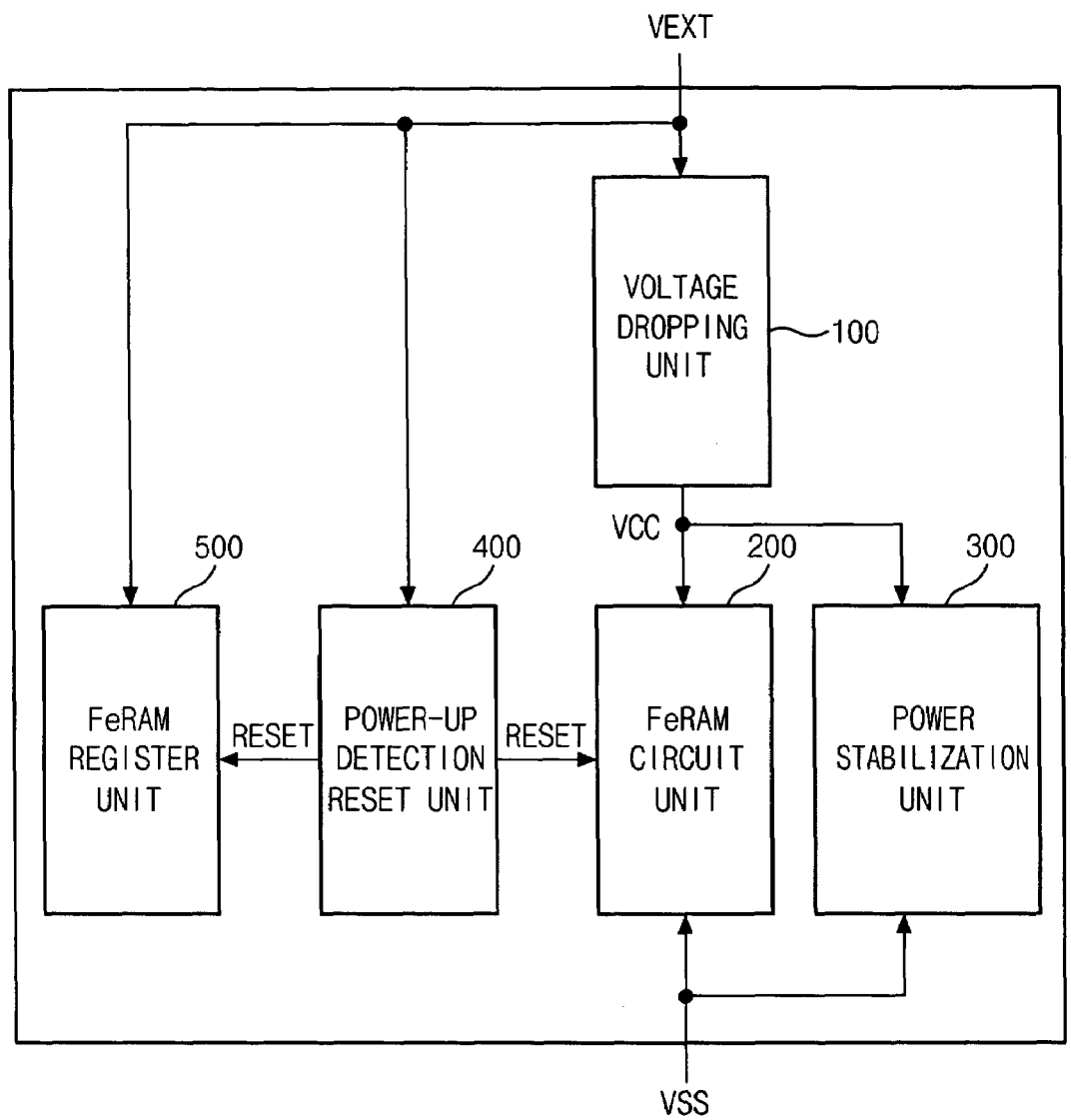

FIG. 3 is a diagram illustrating a third example of a nonvolatile FeRAM device having a power control function according to an embodiment of the present invention.

In the third example, the nonvolatile FeRAM device comprises a voltage dropping unit 100, a FeRAM circuit unit 200, a power stabilization unit 300 and a power-up detection reset unit 400 and a FeRAM register unit 500. Here, the third example of FIG. 3 further comprises the FeRAM register unit 500 in comparison with the second example of FIG. 2.

The operation of the FeRAM register unit 500 is controlled in response to the reset signal RESET applied from the power-up detection reset unit 400. The FeRAM register unit 500 is controlled in response to the external power voltage VEXT.

That is, when a cell of a common semiconductor device is operated, the power voltage VCC is pumped to rise to the level of the external power voltage VEXT. On the other hand, the FeRAM register unit 500 according to an embodiment of the present invention does not pump the power voltage VCC but uses the external power voltage VEXT directly.

Figure 4:
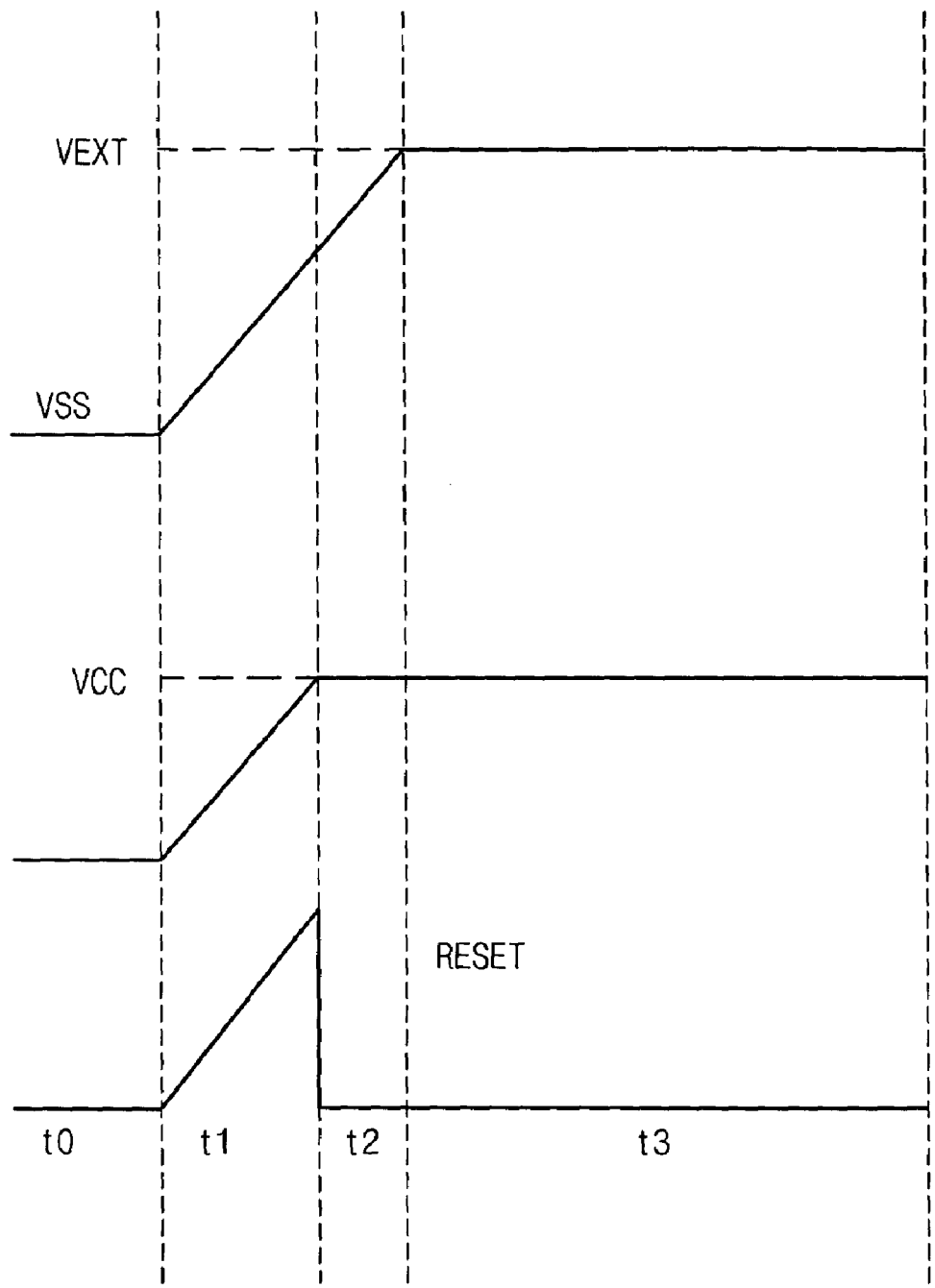
FIG. 4 is a diagram illustrating the operation of the nonvolatile FeRAM device having a power control function according to an embodiment of the present invention.

FIG. 4 is a diagram illustrating the operation of the nonvolatile FeRAM having a power control function according to an embodiment of the present invention.

In an interval t0, a power is not supplied to a chip yet.

When an interval t1 starts, the level of the external power voltage VEXT starts to rise. Here, the interval t1 is a redundant voltage interval where the reset signal RESET can be stably generated.

Thereafter, when an interval t2 starts, the reset signal RESET is generated, and the voltage level of the reset signal RESET reaches the level of the power voltage VCC so that the power voltage VCC is stably generated. Here, the power voltage VCC does not reach the voltage level of the external power voltage VEXT yet.

When an interval t3 starts, the power voltage VCC reaches the level of the external power voltage VEXT. As a result, the external power voltage VEXT is supplied to the inside of the semiconductor device.

Figure 5:
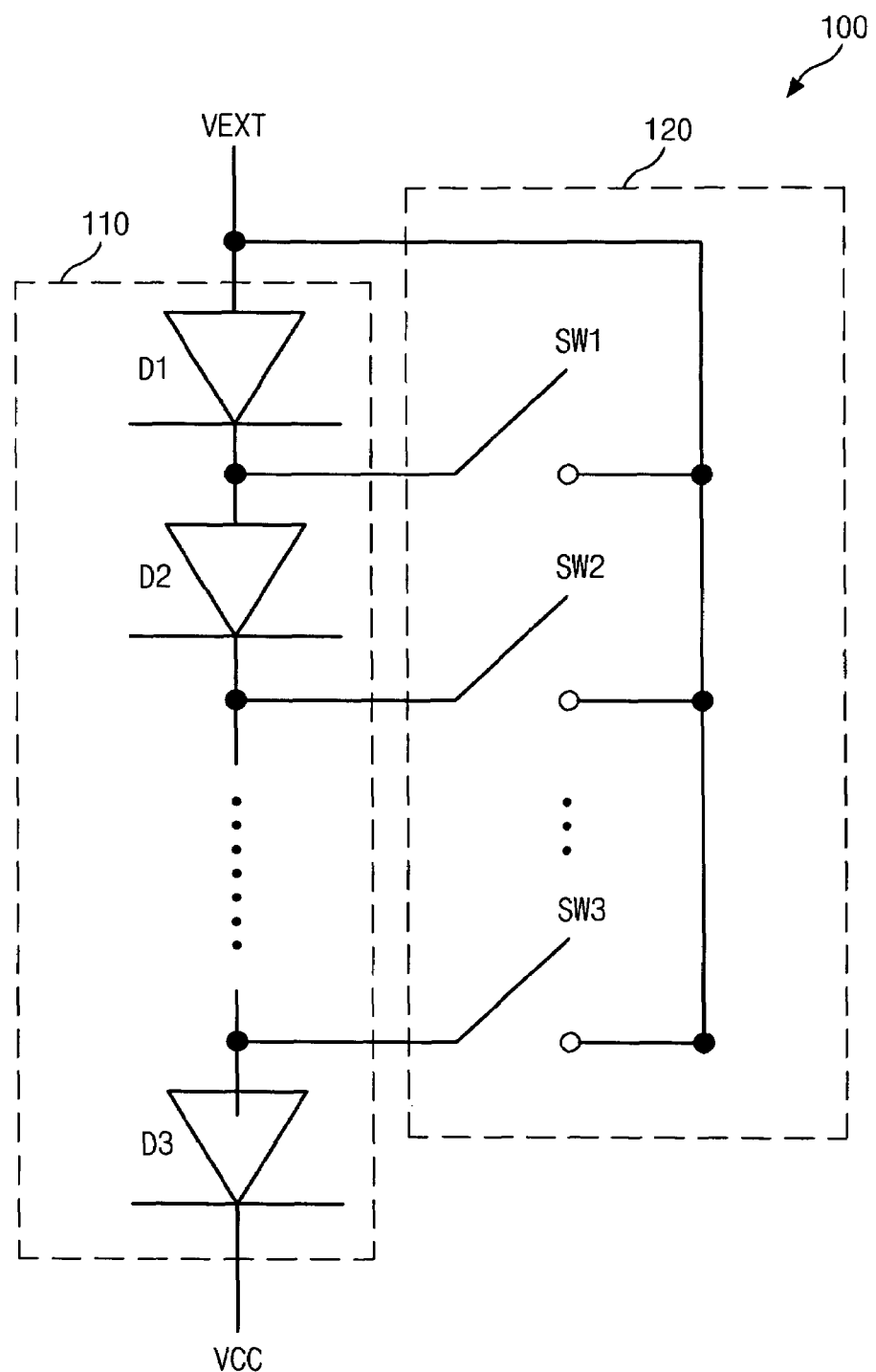
FIG. 5 is a circuit diagram of a voltage dropping unit according to an embodiment of the present invention.

FIG. 5 is a circuit diagram of the voltage dropping unit 100 according to an embodiment of the present invention.

The voltage dropping unit 100 comprises a voltage drop driving unit 110 and a switching unit 120.

Here, the voltage drop driving unit 110 comprises a plurality of diode devices D1~D3 connected serially for sequentially dropping the external power voltage VEXT. Here, each of the plurality of diode devices D1~D3 comprises a PN diode.

The switching unit 120 determines which one of the plurality of diode devices D1~D3 is used. The switching unit 120 comprises a plurality of switches SW1~SW3 for controlling connection of the plurality of diode devices D1~D3.

The voltage dropping unit 100 generates the dropped power voltage VCC depending on the selective usage number of the diode devices D1~D3 serially connected. For example, when the switch SW1 is connected, a short state is caused so that the diode device D1 does not serve as a voltage dropping device. The other switches SW2 and SW3 which are disconnected can drop the external power voltage VEXT by the diode devices D2 and D3.

In an embodiment, an additional power supply circuit is positioned not in the outside of the chip but in the inside of the chip. As a result, the configuration of the system board is simplified, and the regulation range of the power is varied.

Figure 6:
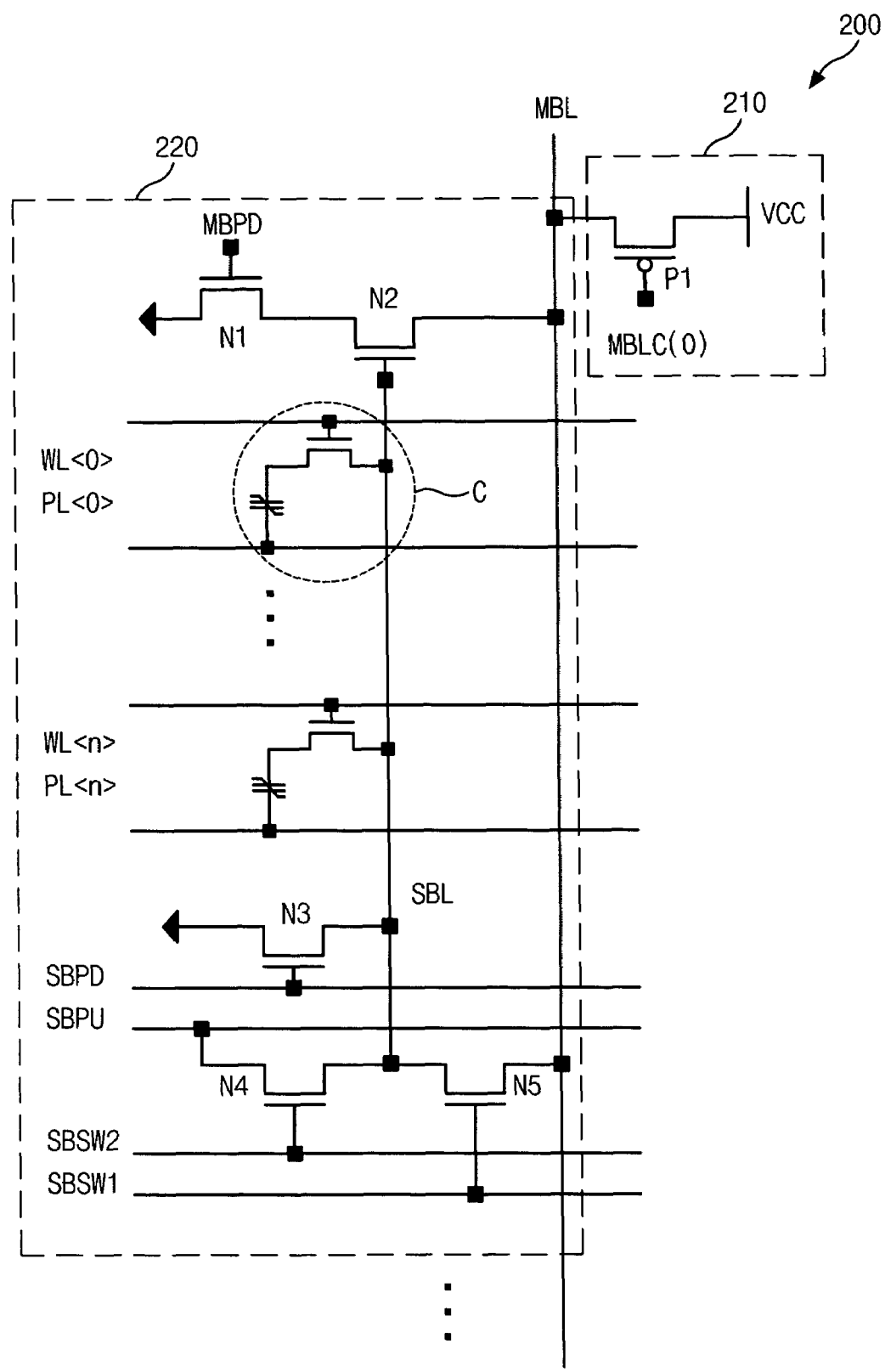
FIG. 6 is a circuit diagram of a FeRAM circuit unit according to an embodiment of the present invention.

FIG. 6 is a circuit diagram of the FeRAM circuit unit 200 according to an embodiment of the present invention.

The FeRAM circuit unit 200 comprises a main bit line load control unit 210 and a plurality of sub cell arrays 220.

Here, the main bit line load control unit 210 comprises a PMOS transistor P1 for controlling sensing load of a main bit line MBL. The PMOS transistor P1 has a source to receive the power voltage VCC, a drain connected to the main bit line MBL and a gate to receive a main bit line control signal MBLC.

The sub cell array 220 has a hierarchical bit line structure comprising a plurality of main bit lines MBL and a plurality of sub bit lines SBL. Each main bit line MBL of the sub cell array 220 is selectively connected to one of the plurality of sub bit lines SBL. That is, when one of a plurality of sub bit line selecting signals SBSW1 is activated, a NMOS transistor N5 is turned on to activated one of the sub bit lines SBL. Also, a plurality of cells C are connected to one of the sub bit lines SBL.

When a sub bit line pull-down signal SBPD is activated to turn on a NMOS transistor N3, the sub bit line SBL is pulled down to a ground level. A sub bit line pull-up signal SBPU is to control a power supplied to the sub bit line SBL. That is, a voltage higher than the power voltage VCC is generated at a low voltage, and supplied to the sub bit line SBL.

A sub bit line selecting signal SBSW2 controls the connection between a sub bit line pull-up signal SBPU terminal and the sub bit line SBL depending on the switching operation of a NMOS transistor N4.

A NMOS transistor N2, connected between a NMOS transistor N1 and the main bit line MBL, has a gate to connected to the sub bit line SBL. The NMOS transistor N1, connected between a ground voltage terminal and the NMOS transistor N2, has a gate to receive a main bit line pull-down signal MBPD, thereby regulating the sensing voltage of the main bit line MBL.

Figure 7:
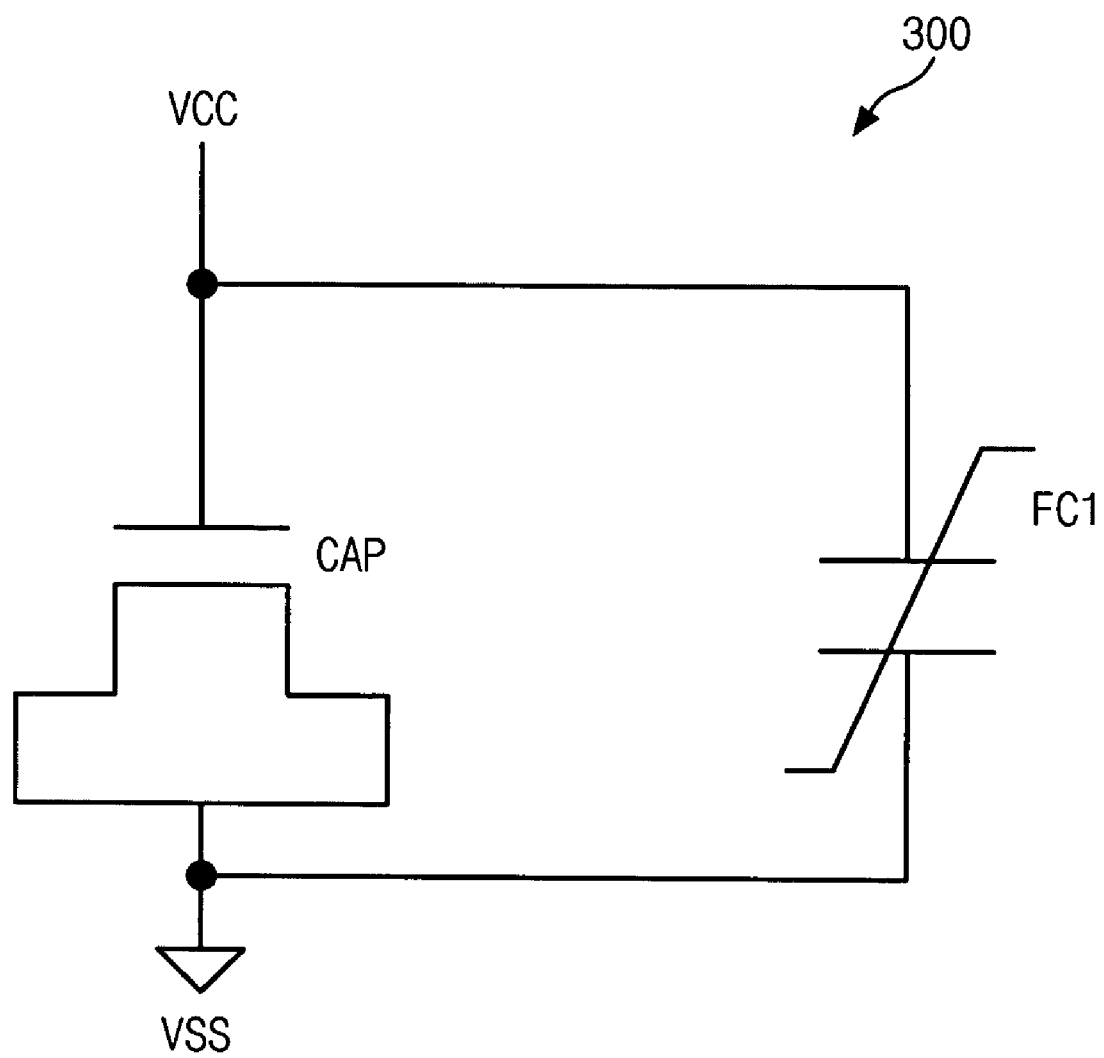
FIG. 7 is a circuit diagram of a power stabilization unit according to an embodiment of the present invention.

FIG. 7 is a circuit diagram of the power stabilization unit 300 according to an embodiment of the present invention.

The power stabilization unit 300 comprises a capacitor CAP and a ferroelectric capacitor FC1 For stabilizing the power voltage VCC.

Here, the capacitor CAP, connected between the power voltage VCC terminal and the ground voltage terminal, has a NMOS gate capacitor structure. The ferroelectric capacitor FC1 is connected in parallel to the capacitor CAP.

Here, when the ferroelectric capacitor FC1 which occupies a relatively small area for stabilization of the power voltage VCC is used to obtain capacitance of high capacity, the reliability of the capacitor can be improved at a high voltage.

Here, the power stabilization unit 300 can comprise at least one of the capacitor CAP and the ferroelectric capacitor FC1 in order to remove noise of the power voltage VCC or can use both of the capacitor CAP and the ferroelectric capacitor FC1 if necessary.

Figure 8:
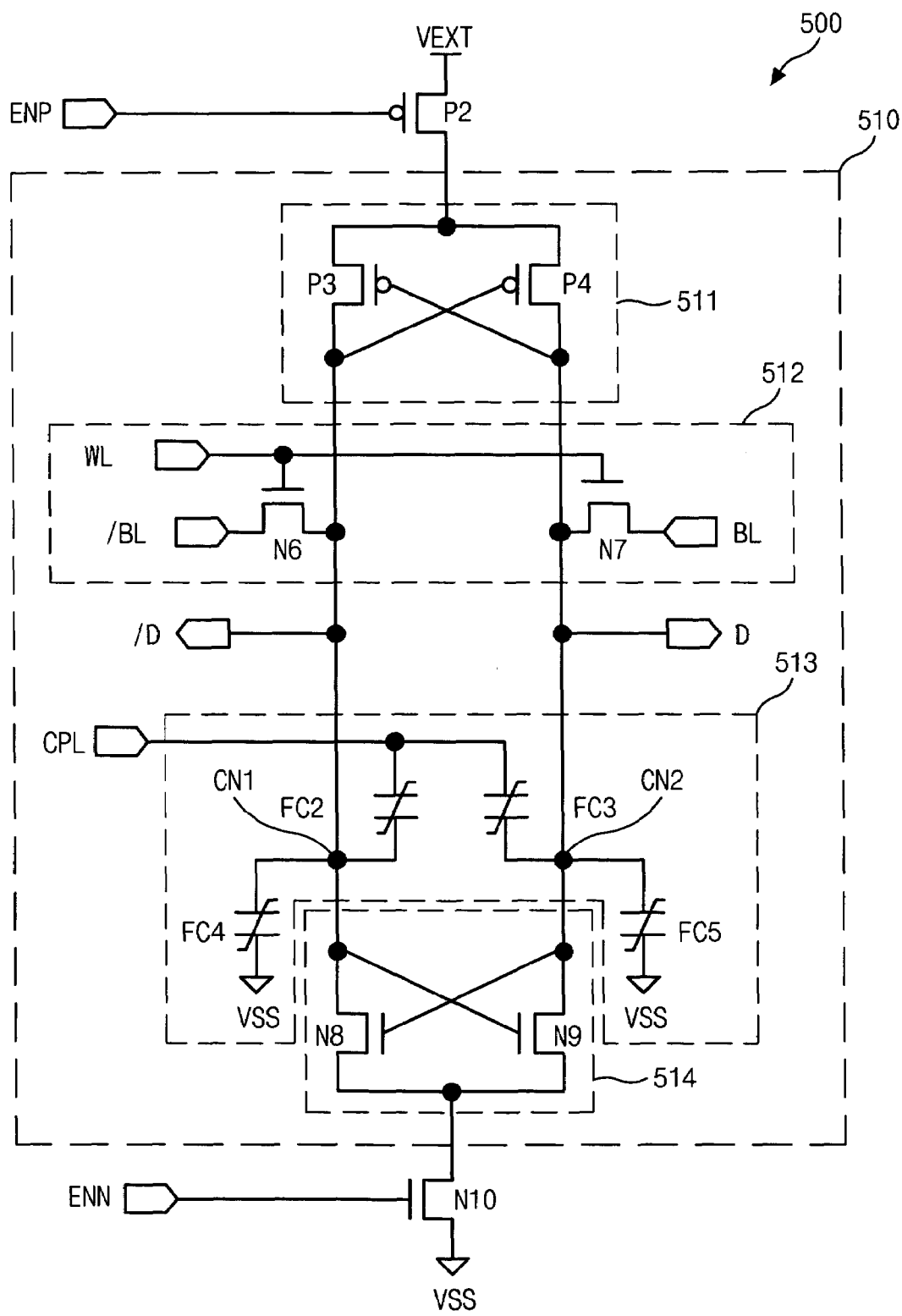
FIG. 8 is a circuit diagram of a FeRAM register unit according to an embodiment of the present invention.

FIG. 8 is a circuit diagram of the FeRAM register unit 500 according to an embodiment of the present invention.

The FeRAM register unit 500 comprises a PMOS transistor P2 as a pull-up regulating device, memory cell 510, and a NMOS transistor N10 as a pull-down regulating device. Here, the memory cell 510 comprises a PMOS latch unit 511, a write/read port selecting unit 512, a ferroelectric capacitor unit 513 and a NMOS latch unit 514.

The PMOS transistor P2, connected between the external power voltage VEXT terminal and the memory cell 510, has a gate to receive a pull-up enable signal ENP. Here, the PMOS transistor P2 selectively supplies the external power voltage VEXT to the memory cell 510.

The PMOS latch unit 511 comprises PMOS transistors P3 and P4 having a latch structure located between the PMOS transistor P2 and the write/read port selecting unit 512. The PMOS transistors P3 and P4 are cross-coupled between nodes CN1 and CN2.

The write/read port selecting unit 512 comprises a NMOS transistor N6 connected between the node CN1 and the internal bit line /BL, and a NMOS transistor N7 connected between the node CN2 and the internal bit line BL. A common gate of the NMOS transistors N6 and N7 is connected to the word line WL.

Here, the internal bit lines BL and /BL can be used as terminals for reading/writing data in the memory cell 510 or as terminals connected to a random external driver.

The ferroelectric capacitor unit 513 comprises ferroelectric capacitors FC2, FC3, FC4 and FC5. The ferroelectric capacitor FC2 has one terminal connected to the node CN1, and the ferroelectric capacitor FC3 has one terminal connected to the node CN2. The other terminals of the ferroelectric capacitors FC2 and FC3 receive a cell plate signal CPL in common. The ferroelectric capacitor FC4 has one terminal connected to the node CN1, and the ferroelectric capacitor FC5 has one terminal connected to the node CN2. The other terminals of the ferroelectric capacitors FC4 and FC5 receive a ground voltage in common. Here, the ferroelectric capacitors FC4 and FC5 can be selectively used depending on loading level control of the nodes CN1 and CN2.

The NMOS latch unit 514 comprises NMOS transistors N8 and N9 located between the ferroelectric capacitor unit 513 and a NMOS transistor N10. The NMOS transistors N8 and N9 are cross-coupled between the nodes CN1 and CN2.

The NMOS transistor N10, connected between the memory cell 510 and the ground voltage VSS terminal, has a gate to receive a pull-down enable signal ENN.

As described above, the memory cell 510 comprises the PMOS latch unit 511 comprising two transistors, the write/read port selecting unit 512 comprising two transistors, and the NMOS latch unit 514 comprising two transistors.

Additionally, the memory cell 510 comprises four ferroelectric capacitors FC2~FC5 for storing nonvolatile data and controlling sensing load. Therefore, the memory cell 510 of FIG. 8 has a 6T4C structure including 6 transistors and 4 capacitors.

Figure 9:
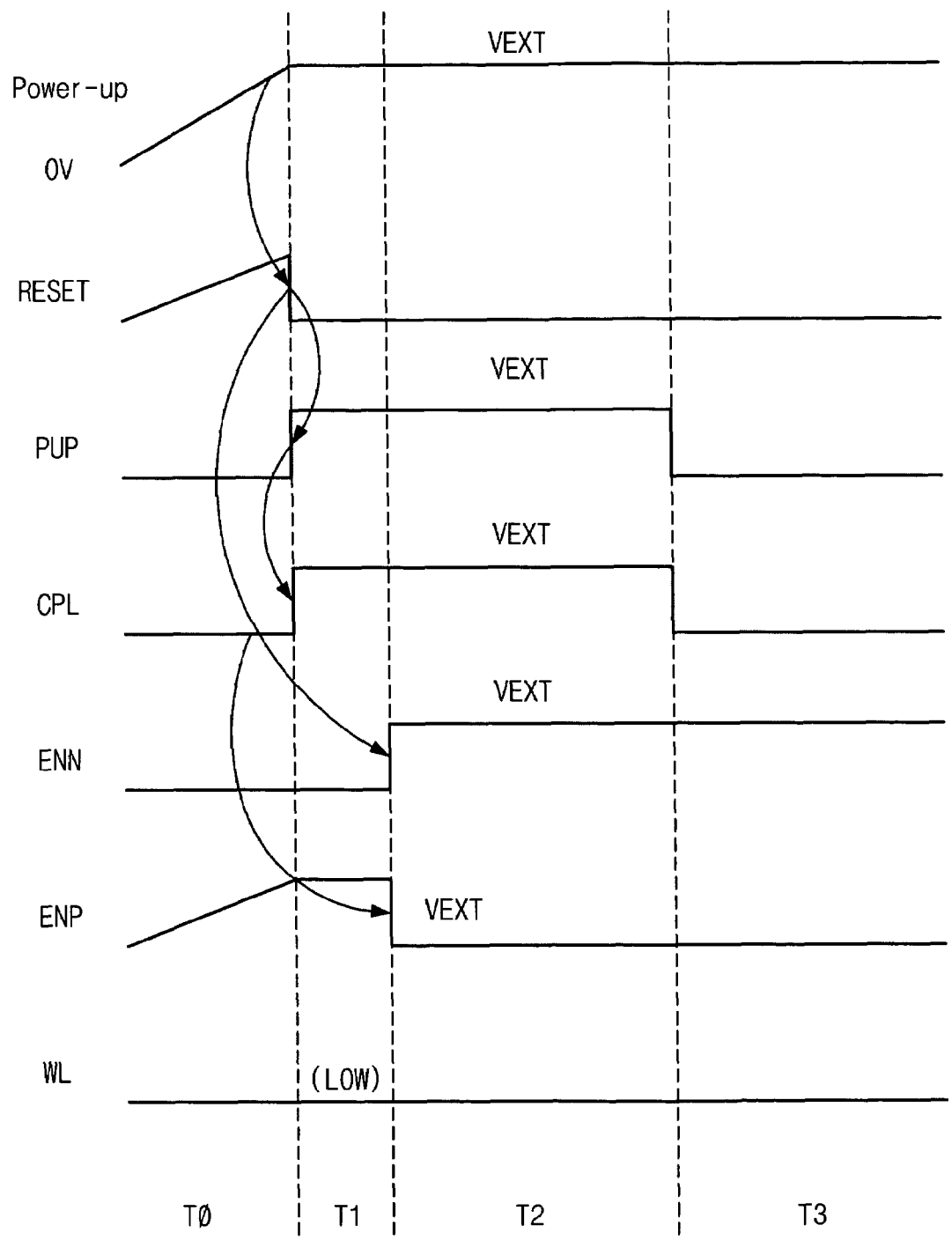
FIG. 9 is a timing diagram illustrating of the power-up operation of the FeRAM register unit of FIG. 8.

FIG. 9 is a timing diagram illustrating of the power-up operation of the FeRAM register unit of FIG. 8.

After a power-up, in an interval T1, if the power voltage reaches the stabilized external power voltage VEXT level, the reset signal RESET is disabled, and a power-up detecting signal PUP is enabled to the external power voltage VEXT level.

Thereafter, the cell plate signal CPL is enabled to the external power voltage VEXT level in response to the power-up detecting signal PUP. Here, charges stored in the ferroelectric capacitors FC2 and FC3 of the FeRAM register unit 500 generate a voltage difference in both nodes of the cell by capacitance load of the ferroelectric capacitors FC4 and FC5.

When an interval T2 where a sufficient voltage difference is generated in both nodes of the cell starts, the pull-down enable signal ENN is enabled to the external power voltage VEXT level. Then, the pull-up enable signal ENP is disabled to 'low', thereby amplifying data of both terminals of the cell.

Thereafter, when an interval T3 starts and the data amplification of both terminals of the cell is completed, the power-up detecting signal PUP and the cell plate signal CPL transit to 'low' again.

As a result, destroyed high data of the ferroelectric capacitor FC2 or FC3 are restored. Here, the word line WL is maintained at the low level to prevent external data from being written in the cell.

Figure 10:
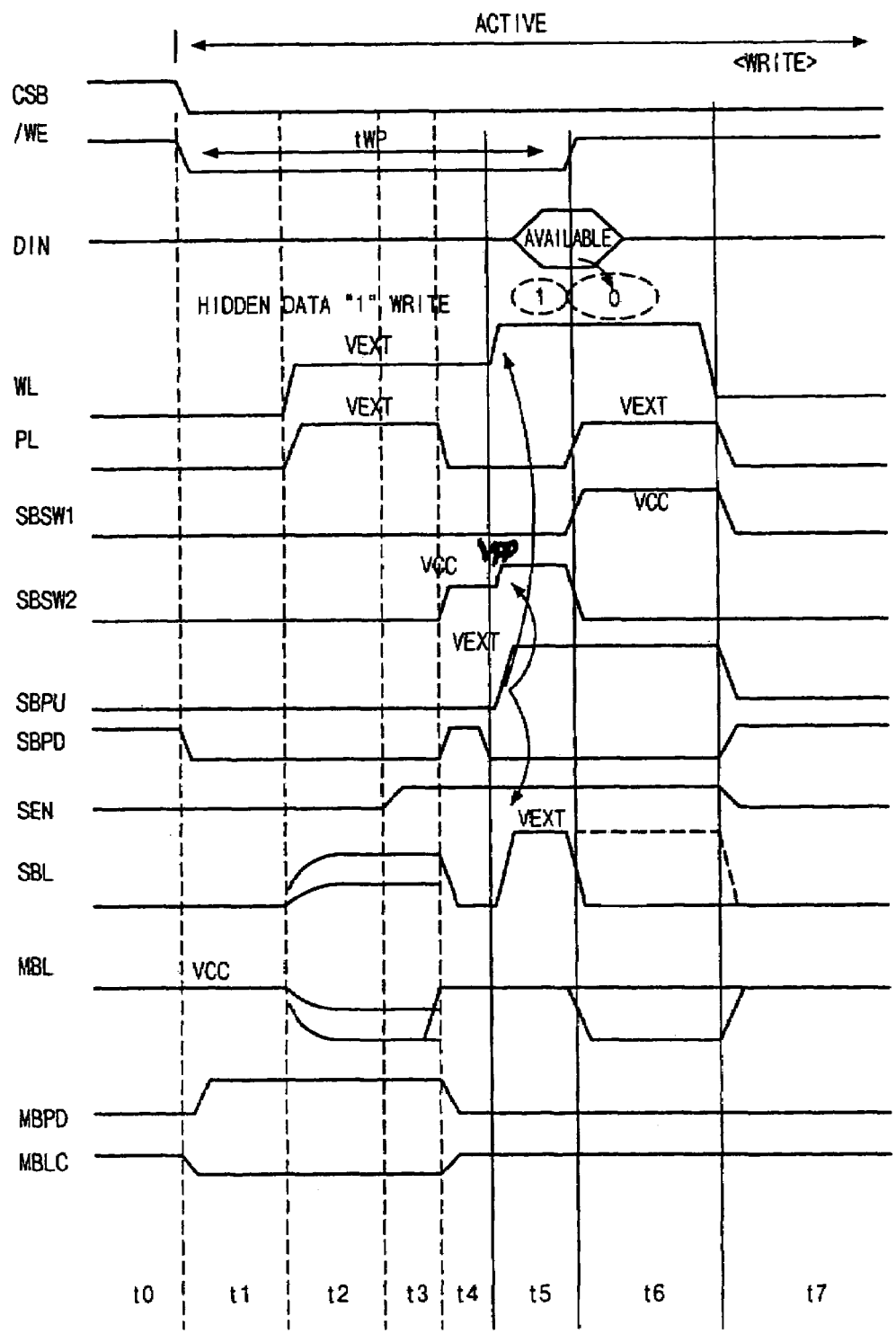
FIG. 10 is a timing diagram illustrating of the write operation of the nonvolatile FeRAM device having a power control function according to an embodiment of the present invention.

FIG. 10 is a timing diagram illustrating of the write operation of the nonvolatile FeRAM having a power control function according to an embodiment of the present invention.

When an interval t1 starts, an address is inputted, a chip selecting signal CSB and a write enable signal /WE are disabled to 'low', the nonvolatile ferroelectric memory becomes at a write mode active state. The sub bit line pull-down signal SBPD and the main bit line control signal MBLC are disabled to 'low', the power voltage VCC is applied to the main bit line MBL. Here, the main bit line pull-down signal MBPD is enabled.

Thereafter, when an interval t2 starts, the word line WL and a plate line PL are enabled to the external power voltage VEXT level, the voltage levels of the sub bit line SBL and the main bit line MBL rise.

When an interval t3 starts, a sense amplifier enable signal SEN is enabled, and cell data applied to the main bit line MBL.

Thereafter, when an interval t4 starts, the plate line PL is disabled to 'low', the sub bit line selecting signal SBSW2 is enabled to the power voltage VCC level. Then, the sub bit line pull-down signal SBPD is enabled to 'high', and the sub bit line SBL is disabled to 'low' Here, the main bit line pull-down signal MBPD is disabled to 'low', and the main bit line control signal MBLC is enabled.

Next, in an interval t5, effective data are applied to the cell, and hidden data "1" is written. Then, the voltage of the word line WL rises, and the sub bit line selecting signal SBSW2 is enabled to the pumping voltage level VPP level in response to the sub bit line pull-up signal SBPU. As a result, the voltage level of the sub bit line SBL rises to the external power voltage VEXT level.

In an interval t6, data are written in response to the write enable signal /WE. When the interval t6 starts, the plate line PL is enabled to the external power voltage VEXT level again. Then, the sub bit line selecting signal SBSW1 is enabled to the power voltage VCC level, and the sub bit line selecting signal SBSW2 is disabled, thereby writing new data in a page cell.

When an interval t7 starts, the word line WL, the plate line PL, the sub bit line selecting signal SBSW1, the sub bit line pull-up signal SBPU and the sense amplifier enable signal are disabled. Then, the sub bit line pull-down signal SBPD is enabled.

Figure 11:
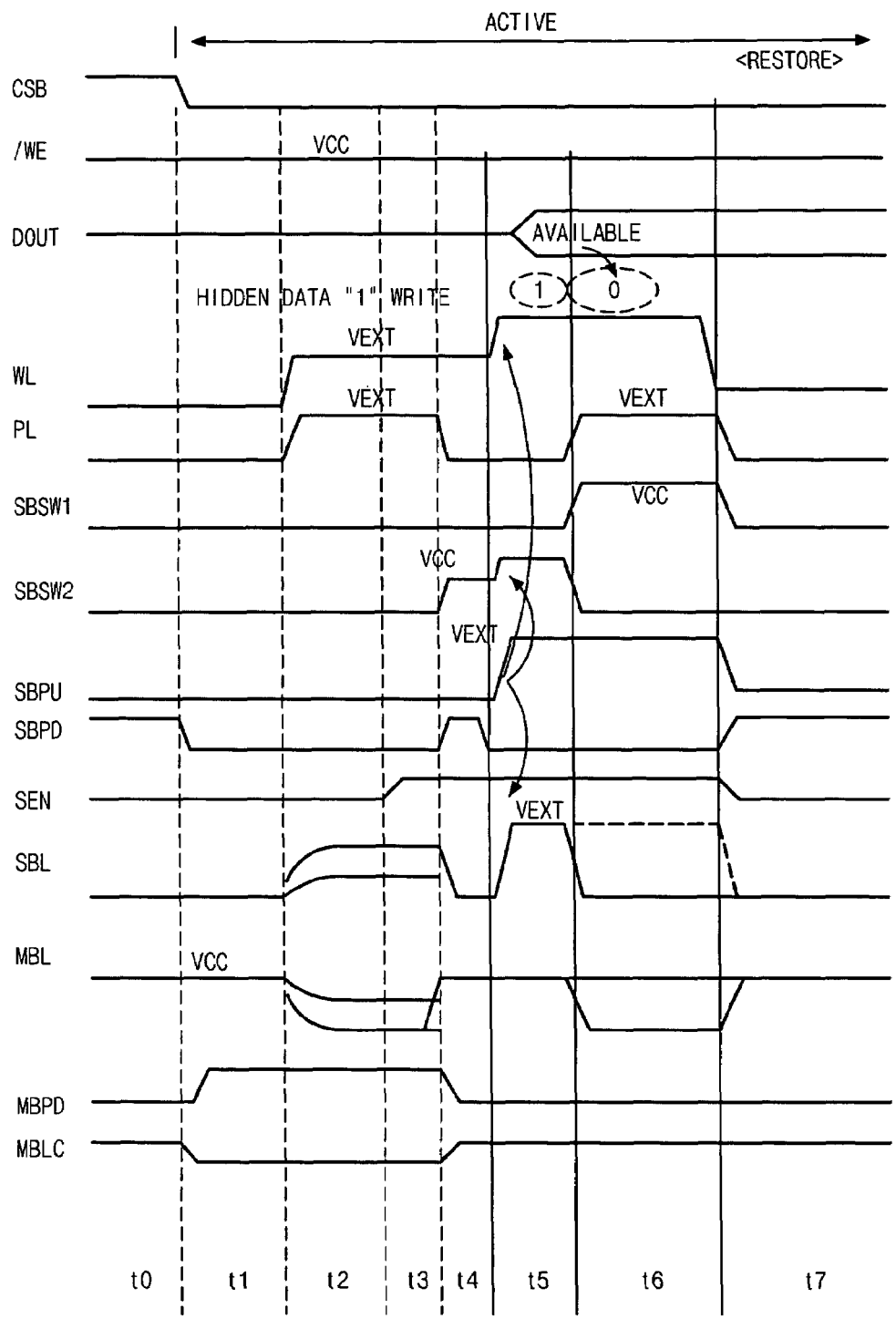
FIG. 11 is a timing diagram illustrating of the read operation of the nonvolatile FeRAM device having a power control function according to an embodiment of the present invention.

FIG. 11 is a timing diagram illustrating of the read operation of the nonvolatile FeRAM having a power control function according to an embodiment of the present invention.

In the read mode, the write enable signal /WE is maintained at the power voltage VCC level. In intervals t2 and t3, data are sensed. In an interval t5, hidden data "1" is written, and high level data are written in all cells of the page. During intervals t6~t8, data output effective period is maintained.

In the interval t6, the plate line PL transits to 'high', the sub bit line selecting signal SBSW1 transits to 'high', and restoration data are written in the cell of the page.

As described above, in the write/read operations according to an embodiment of the present invention, the external power voltage VEXT is supplied to the word line WL, the plate line PL, the sub bit line pull-up signal SBPU and the sub bit line SBL, thereby increasing the operation voltage of the cell.

Accordingly, a nonvolatile FeRAM device according to an embodiment of the present invention provides the following effects: to improve a sensing margin of a cell and reduce unnecessary power consumption by controlling an operation voltage of the cell depending on an external supply voltage VEXT and applying a power voltage VCC obtained by dropping an external power voltage to adjacent circuits; to improve reliability of a capacitor at a high voltage by employing a ferroelectric capacitor for stabilizing power to obtain capacitance of high capacity with a small area; and to simplify configuration of a system board and vary a regulation range of power by positioning a power supply circuit not in the outside but in the inside of a chip.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device having a power control function, comprising:
   a voltage dropping unit for dropping an external power voltage to a predetermined level and supplying an internal power voltage;
   a nonvolatile ferroelectric circuit unit having a hierarchical bit line structure including a plurality of sub bit lines connected to one of a plurality of main bit lines and including a first nonvolatile ferroelectric capacitor for reading/writing data depending on the internal power voltage, wherein a voltage of a sub bit line induced by cell data is converted into current by a current controller according to the voltage of the sub bit line so that a sensing voltage of a main bit line is induced;
   a power stabilization unit including a second ferroelectric capacitor and a capacitor connected in parallel between the internal power voltage and a ground voltage for reducing noise from the internal power voltage applied from the voltage dropping unit to stabilize the internal power voltage;
   a power-up detection reset unit for detecting the external power voltage level and generating a reset signal to initialize the nonvolatile ferroelectric circuit unit; and
   a nonvolatile ferroelectric register unit, driven depending on the external power voltage, for storing cell data in a nonvolatile memory cell, wherein the nonvolatile ferroelectric register unit comprises:
   a pull-up regulating unit for selectively supplying the external power voltage in response to a pull-up enable signal;
   a pull-down regulating unit for selectively supplying a ground voltage to the nonvolatile memory cell in response to a pull-down enable signal; and
   the nonvolatile memory cell for storing the cell data depending on the external power voltage applied from the pull-up regulating unit, wherein the nonvolatile memory cell comprises:
   a pull-up latch unit having a cross-coupled structure for latching the external power voltage applied from the pull-up regulating unit;
   a write/read port selecting unit for selectively connecting an internal bit line to nodes at both output terminals in response to a word line driving signal, and controlling a write operation;
   a ferroelectric capacitor unit, connected to the node at both output terminals, for storing the cell data into a plurality of third nonvolatile ferroelectric capacitors in response to a cell plate signal; and
   a pull-down latch unit having a cross-coupled structure for latching the ground voltage applied from the pull-down regulating unit.

2. The nonvolatile ferroelectric memory device according to claim 1, wherein the reset signal is activated when the external power voltage reaches the predetermined level.

3. The nonvolatile ferroelectric memory device according to claim 1, wherein the voltage dropping unit comprises:
   a voltage dropping driving unit, including a plurality of voltage dropping means serially connected between the external power voltage and the internal power voltage terminal; and
   a switching unit for selectively using the plurality of voltage dropping means.

4. The nonvolatile ferroelectric memory device according to claim 3, wherein the plurality of voltage dropping means each includes PN diode devices.

5. The nonvolatile ferroelectric memory device according to claim 3, wherein the switching unit comprises a plurality of switches which are connected in parallel to the plurality of voltage dropping means, wherein the plurality of switches each selectively couples to the both terminals of the corresponding voltage dropping means.

6. The nonvolatile ferroelectric memory device according to claim 1, wherein the nonvolatile ferroelectric circuit unit comprises:
   a main bit line load control unit for controlling load of the main bit line depending on selective supply of the internal power voltage; and
   a plurality of sub cell arrays each having a plurality of nonvolatile cells, wherein the plurality of nonvolatile cells each includes-the first nonvolative ferroelectric capacitor.

7. The nonvolatile ferroelectric memory device according to claim 1, wherein the capacitor includes an NMOS gate MOS capacitor.

* * * * *